United States Patent
Hou

(10) Patent No.: US 11,037,998 B2
(45) Date of Patent: Jun. 15, 2021

(54) PIXEL DEFINING LAYER, PIXEL STRUCTURE, DISPLAY PANEL AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/607,923

(22) PCT Filed: Apr. 8, 2019

(86) PCT No.: PCT/CN2019/081755
§ 371 (c)(1),
(2) Date: Oct. 24, 2019

(87) PCT Pub. No.: WO2019/196798
PCT Pub. Date: Oct. 17, 2019

(65) Prior Publication Data
US 2020/0098840 A1  Mar. 26, 2020

(30) Foreign Application Priority Data
Apr. 11, 2018 (CN) .......................... 201820513650.X

(51) Int. Cl.
*H01L 27/32* (2006.01)

(52) U.S. Cl.
CPC ...... *H01L 27/3246* (2013.01); *H01L 27/3216* (2013.01); *H01L 27/3283* (2013.01)

(58) Field of Classification Search
CPC ............. H01L 27/3246; H01L 27/3283; H01L 27/3216; H01L 27/3295; H01L 27/326; H01L 51/5284
See application file for complete search history.

(56) References Cited

U.S. PATENT DOCUMENTS

2016/0181327 A1*  6/2016  Im ....................... H01L 51/0013
                                                        257/40
2019/0198580 A1*  6/2019  Youn ................... H01L 27/3246

FOREIGN PATENT DOCUMENTS

| CN | 107591432 A | 1/2018 |
| CN | 207947279 U | 10/2018 |
| JP | 2004034472 A | 2/2004 |

* cited by examiner

*Primary Examiner* — Joseph C. Nicely

(57) ABSTRACT

A pixel defining layer, a pixel structure, a display panel and a display device are provided. The pixel defining layer includes: a plurality of pixel defining patterns arranged in a row direction and a column direction, each of the pixel defining patterns having an opening. In the row direction, the openings in at least two adjacent pixel defining patterns have different sizes in the row direction, and adjacent openings of the pixel defining patterns in the same row have equal minimum distances (a, b, c) in the row direction.

14 Claims, 4 Drawing Sheets

PIXEL DEFINING LAYER, PIXEL STRUCTURE, DISPLAY PANEL AND DISPLAY DEVICE

The application claims priority to the Chinese patent application No. 201820513650.X, filed on Apr. 11, 2018, the entire disclosure of which is incorporated herein by reference as part of the present application.

TECHNICAL FIELD

The present disclosure relates to a pixel defining layer, a pixel structure, a display panel and a display device.

BACKGROUND

Compared with a traditional liquid crystal display (LCD), an organic light-emitting diode (OLED) device has advantages of self-luminous property, rapid response, wide view angle, high brightness, bright colors, a small weight, thinness, or the like, and is considered as the next generation of display technologies.

An OLED device mainly includes an anode electrode layer, an organic light-emitting functional layer and a cathode electrode layer, wherein the organic light-emitting functional layer is a core of the OLED device. A thin film deposition method of the organic light-emitting functional layer may be classified into vacuum evaporation and solution processing according to light-emitting materials, wherein the vacuum evaporation is suitable for organic small-molecule electroluminescent materials, forms a film with good uniformity, and is a comparatively mature technology, but has a great equipment investment, a low material utilization and a low alignment accuracy of Mask for a large-size-product; the solution processing includes spin coating, ink jet printing, nozzle coating methods, or the like, is suitable for macromolecule polymer materials and soluble small molecules, has low equipment costs, and is superior in mass and large-size production. Taking the ink-jet printing technology as an example, a solution may be sprayed into a pixel region accurately to form an organic thin film. However, the ink-jet printing technology has the greatest difficulty in that the organic solution may not form the organic thin films with a uniform thickness in the pixel region.

It should be noted that information disclosed in the part of background is merely used for strengthening understanding of the background of the present disclosure, and therefore may include information not belonging to the prior art known to those skilled in the art.

SUMMARY

At least one embodiment of the disclosure provides a pixel defining layer, comprising: a plurality of pixel defining patterns arranged in a row direction and a column direction, each of the pixel defining patterns having an opening, wherein, in the row direction, the openings in at least two adjacent pixel defining patterns have different sizes in the row direction, and adjacent openings of the pixel defining patterns in the same row have equal minimum distances in the row direction.

In some examples, the pixel defining patterns are made of an insulating material.

In some examples, the plurality of pixel defining patterns have profiles with identical shape and size.

In some examples, the adjacent pixel defining patterns are in contact with each other.

In some examples, the adjacent pixel defining patterns are formed integrally. In some examples, the adjacent openings arranged in a same row are configured for defining pixel units in different colors.

In some examples, the openings arranged in a same column are configured for defining pixel units in a same color.

In some examples, the pixel defining patterns comprises: a red pixel defining pattern having a first opening, for defining a red pixel unit; a green pixel defining pattern having a second opening, for defining a green pixel unit; and a blue pixel defining pattern having a third opening, for defining a blue pixel unit.

In some examples, a width of the first opening is less than a width of the second opening, and the width of the second opening is less than a width of the third opening.

In some examples, the plurality of pixel defining patterns comprise a first pixel defining pattern, a second pixel defining pattern and a third pixel defining pattern which have different sizes in the row direction, and centers of at least two of the first, second and third pixel defining patterns are not inconsistent with centers of the corresponding openings.

In some examples, the adjacent openings of the pixel defining patterns arranged in a same column have equal minimum distances in the column direction.

At least one embodiment provides a pixel structure, comprising: the pixel defining layer as mentioned above, for defining a plurality of pixel regions on a base substrate; and a plurality of pixel units provided in the plurality of pixel regions respectively. In some examples, the pixel units are located in the openings of the pixel defining layer.

At least one embodiment of the disclosure provides a display panel, comprising: a base substrate; and a pixel structure formed on the base substrate, wherein the pixel structure is the pixel structure as mentioned above.

At least one embodiment of the disclosure provides a display device, comprising the display panel as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Furthermore, described features, structures, or characteristics may be combined in one or more embodiments by any suitable manner. In the following description, numerous specific details are provided to give full understandings of the embodiments of the present disclosure. However, those skilled in the art will appreciate that, technical solutions provided in the resent disclosure may be practiced but omitting one or more specific details, or by other methods, components, apparatus, steps, etc. In other cases, well-known structures, methods, apparatus, implements, materials, or operations will not be shown or described to avoid distractions that make aspects of the present disclosure become vague.

Figure 1:
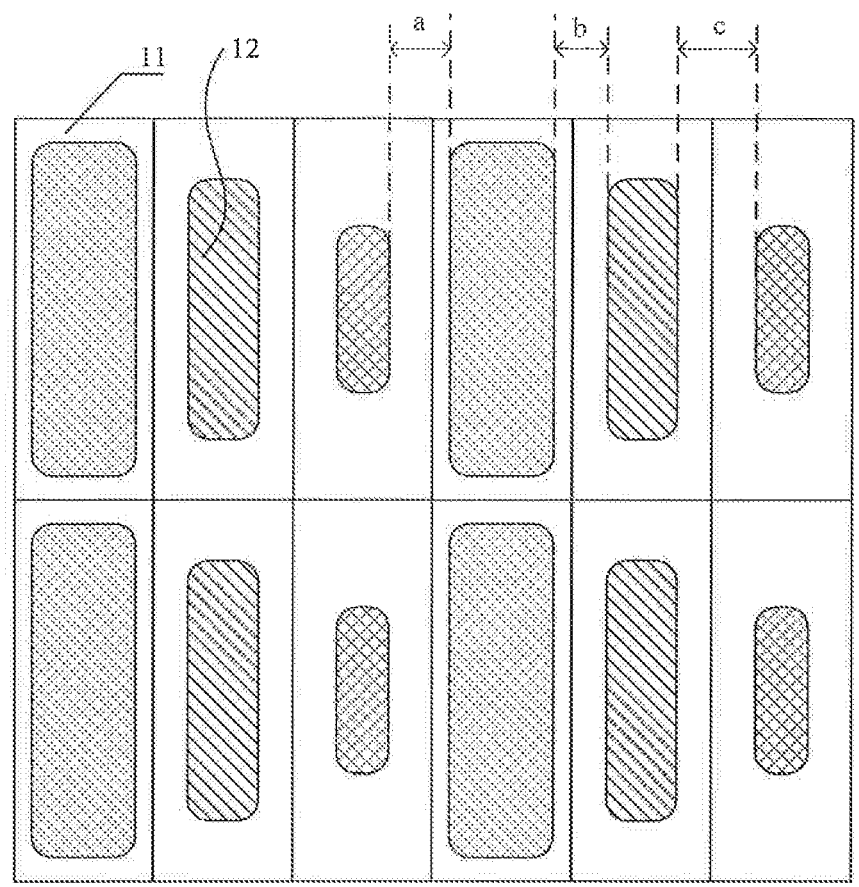
FIG. 1 shows a schematic diagram of a pixel defining layer according to a related embodiment of the present disclosure.

FIG. 1 shows a schematic diagram of a pixel defining layer according to a related embodiment of the present disclosure. As shown in FIG. 1, the pixel units are arranged so that space between centers of adjacent pixel units is of a constant value. However, in this case, due to specific differences in different colors of materials, the intervals between the adjacent pixel units are different. Taking FIG. 1 as an example, the pixel defining layer includes a plurality of pixel defining patterns 11 with openings 12 therein.

The interval between a red pixel unit and a blue pixel unit is a, the interval between a blue pixel unit and a green pixel unit is 13, and the interval between a green pixel unit and a red pixel unit is c. The red, green and blue pixel units have equal center distances, but since the three pixel units in different colors have different widths, minimum distances between boundaries of the adjacent pixel units are different i.e., c>a>b.

For the pixel defining layer shown in FIG. 1, since left and right sides of the pixel unit have different microenvironments, when each layer of thin films of the pixel units is formed through ink-jet printing, it may be difficult to form the thin films with a uniform thickness in the pixel regions.

Figure 2:
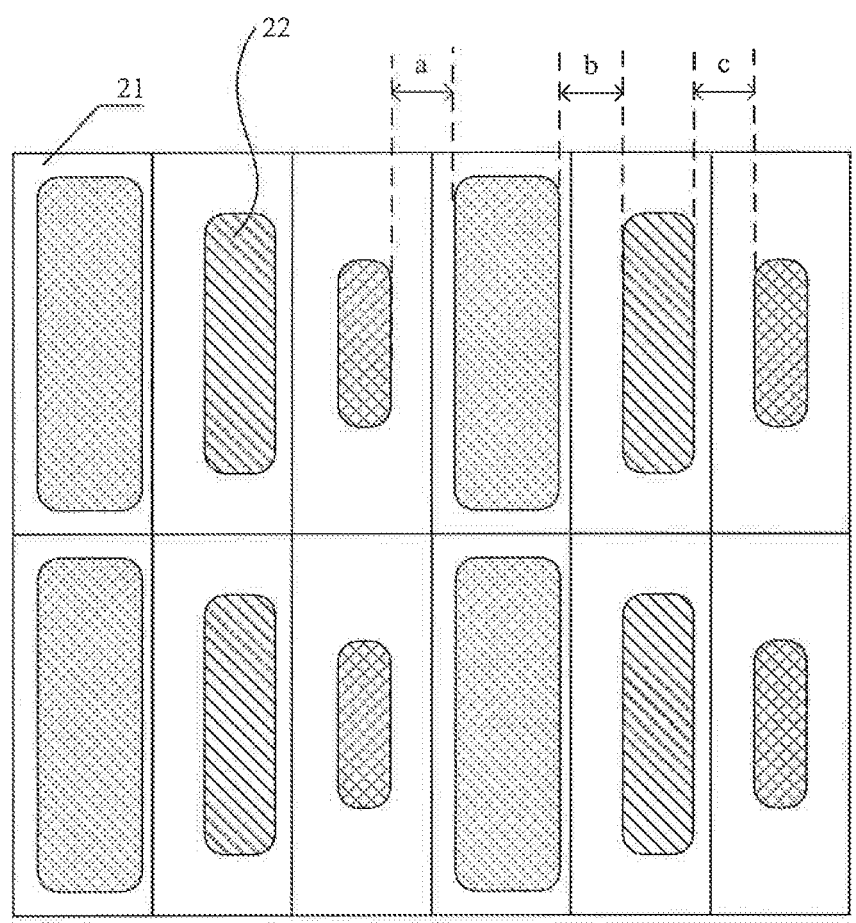
FIG. 2 shows a schematic diagram of a pixel defining layer according to an exemplary embodiment.

FIG. 2 shows a schematic diagram of a pixel defining layer according to an exemplary embodiment. As shown in FIG. 2, the pixel defining layer includes a plurality of pixel defining patterns 21 distributed in a matrix, each pixel defining pattern 21 has an opening 22, the pixel defining patterns 21 adjacently arranged in the same row have the openings 22 with different widths in a first direction, and the two adjacent openings 22 in the same row have the same minimum distance. The first direction is a direction in which the pixel defining patterns in the same row are arranged.

For example, the above-mentioned first direction is a row direction. The pixel defining patterns distributed in the matrix are arranged in the row direction and a column direction intersecting the row direction. For example, the row direction and the column direction are perpendicular to each other. For example, as shown in FIG. 2, in a principal plane, the transverse direction is the row direction, and a direction perpendicular to the row direction is the column direction.

For example, the openings having different widths in the first direction refer to the openings of the pixel defining patterns arranged adjacently having different sizes in the row direction, and the two adjacent openings in the same row having the same minimum distance means that the two adjacent openings in the same row have the same minimum distance in the row direction.

According to the present exemplary embodiment, since the pixel defining patterns arranged adjacently in the same row in the pixel defining layer have the openings with different widths in the first direction, and the two adjacent openings in the same row having the same minimum distance, the width on two sides of the openings may be ensured to be equal, thereby guaranteeing the same microenvironment on the two sides of the pixel unit at the opening, which more facilitates the film forming uniformity in the pixel units.

Next, the pixel defining layer according to the present exemplary embodiment will be explained in detail in conjunction with FIGS. 2-4.

As shown in FIG. 2, the pixel defining layer includes a plurality of pixel defining patterns distributed in the matrix, and the pixel defining patterns have openings therein. The structures shown in FIGS. 2 and 1 have the following differences: centers of the pixel defining patterns shown in FIG. 1 are consistent with centers of the openings in the pixel defining patterns, but the minimum distances between the openings are different; the centers of the pixel defining patterns shown in FIG. 2 are not all consistent with the centers of the openings in the pixel defining patterns, but the minimum distances between the openings are the same.

Taking FIG. 2 as an example, the pixel defining layer includes the plurality of pixel defining patterns 21 distributed in a matrix, each pixel defining pattern 21 has one opening 22, the pixel defining patterns 21 adjacently arranged in the same row have the openings 22 with different widths in the first direction, and the two adjacent openings 22 in the same row have equal minimum distance. The minimum distance between the two adjacent openings refers to the distance between two closest sides of the two openings.

In the present exemplary embodiment, the pixel defining patterns 21 are made of insulating materials, such as polyimide or acrylic photoresist. Other organic insulating materials or some inorganic materials may also be used, such as silicon oxide or silicon nitride.

In the present exemplary embodiment, the plurality of pixel defining patterns 21 have the profiles with the same shape and size, and the adjacent pixel defining patterns 21 are arranged closely. Referring to FIG. 2, all the six pixel defining patterns 21 in the first row are arranged closely, and have the profiles with the same shape and size. Similarly, all the six pixel defining patterns 21 in the second row are also arranged closely, and have the profiles with the same shape and size.

For example, the adjacent pixel defining patterns being arranged closely means that the adjacent pixel defining patterns come into contact with each other. However, the embodiments according to the present disclosure are not limited thereto. For example, the adjacent pixel defining patterns are formed integrally. For example, the entire pixel defining layer is formed integrally, and includes therein the plurality of openings arranged in a matrix direction. In this case; the entire pixel defining layer may be virtually divided into a plurality of pixel defining layers, but portions of the pixel defining layers between adjacent openings do not have substantial boundaries.

In the present exemplary embodiment, the adjacent openings arranged in the same row are configured for defining pixel units in different colors. Taking FIG. 2 as an example, the pixel defining pattern includes a red pixel defining pattern, a green pixel defining pattern and a blue pixel defining pattern, i.e., a group of pixel defining patterns arranged adjacently in the same row includes the blue, green and red pixel defining patterns respectively, and the corresponding openings arranged adjacently in the same row are used for defining the blue, green and red pixel defining patterns respectively.

In the present exemplary embodiment, the openings arranged in the same column are used for defining the pixel units in the same colors. Still taking FIG. 2 as an example, the pixel defining patterns in the first and fourth columns are blue pixel defining patterns, i.e., the openings define the blue pixel units; the pixel defining patterns in the second and fifth columns are green pixel defining patterns, i.e., the openings define the green pixel units; the pixel defining patterns in the third and sixth columns are red pixel defining patterns, i.e., the openings define the red pixel units.

For example, in some embodiments, the adjacent openings of the pixel defining patterns arranged in the same column have equal minimum distances in the column direction. For example, as shown in FIG. 2, in the first and fourth columns, the openings of the plurality of blue pixel defining patterns have equal minimum distance in the column direction; in the second and fifth columns, the openings of the plurality of green pixel defining patterns have equal minimum distance in the column direction; in the third and sixth columns, the openings of the plurality of red pixel defining patterns have equal minimum distance in the column direction.

In the present exemplary embodiment, the adjacent openings arranged in the same row (i.e., the opening distributed in the first direction) have different widths. Still taking FIG. 2 as an example, the red pixel defining pattern has a first opening for defining the red pixel unit; the green pixel defining pattern has a second opening for defining the green pixel unit; the blue pixel defining pattern has a third opening for defining the blue pixel unit; a width of the first opening is less than a width of the second opening, and the width of the second opening is less than a width of the third opening.

Based on the foregoing descriptions, compared with the structure shown in FIG. 1, in the pixel defining layer according to the present exemplary embodiment, the centers of the pixel defining patterns corresponding to at least one or two of one group of red, green and blue pixel units are inconsistent with the centers of the openings thereof. Taking FIG. 2 as an example, the openings arranged in the first row define the blue, green and red pixel units successively, and then repetition is made, the center of the blue pixel unit is shifted rightwards relative to the center of the blue pixel defining pattern, the center of the green pixel unit is shifted rightwards relative to the center of the green pixel defining patterns, and the center of the red pixel unit is not shifted relative to the center of the red pixel defining pattern. In this way, the minimum distance a between the boundary of the red pixel unit and the boundary of the adjacent blue pixel unit is equal to the minimum distance h between the boundary of the blue pixel unit and the boundary of the adjacent green pixel unit, and also equal to the minimum distance a between the boundary of the green pixel unit and the boundary of the adjacent red pixel unit, i.e., a=b=c.

It should be noted that although the center of the pixel unit is shifted relative to the center of the pixel defining pattern, since the pixel defining patterns are made of the same material, in the case where the pixel defining patterns between the adjacent pixel units have the same width, in order to form organic light-emitting materials at the openings by the ink-jet printing in the following process, after the organic light-emitting materials are coated into the openings, the same microenvironment on the left and right sides may be provided for the organic light-emitting materials of each pixel unit, thereby guaranteeing the uniformity of the organic films in the pixel units.

In conclusion, with respect to the pixel defining layer according to certain embodiments of the present disclosure, on one hand, since the pixel defining patterns arranged adjacently in the same row in the pixel defining layer have the openings with different widths in the first direction, and the two adjacent openings in the same row have equal minimum distance, the widths on the two sides of the openings may be guaranteed to be equal, thereby guaranteeing the same microenvironment on the two sides of the pixel units at the openings, which more facilitates the film forming uniformity in the pixel units; on the other hand, the pixel defining layer is improved to be better suitable for preparing an organic light-emitting device in the ink-jet printing manner.

Figure 3:
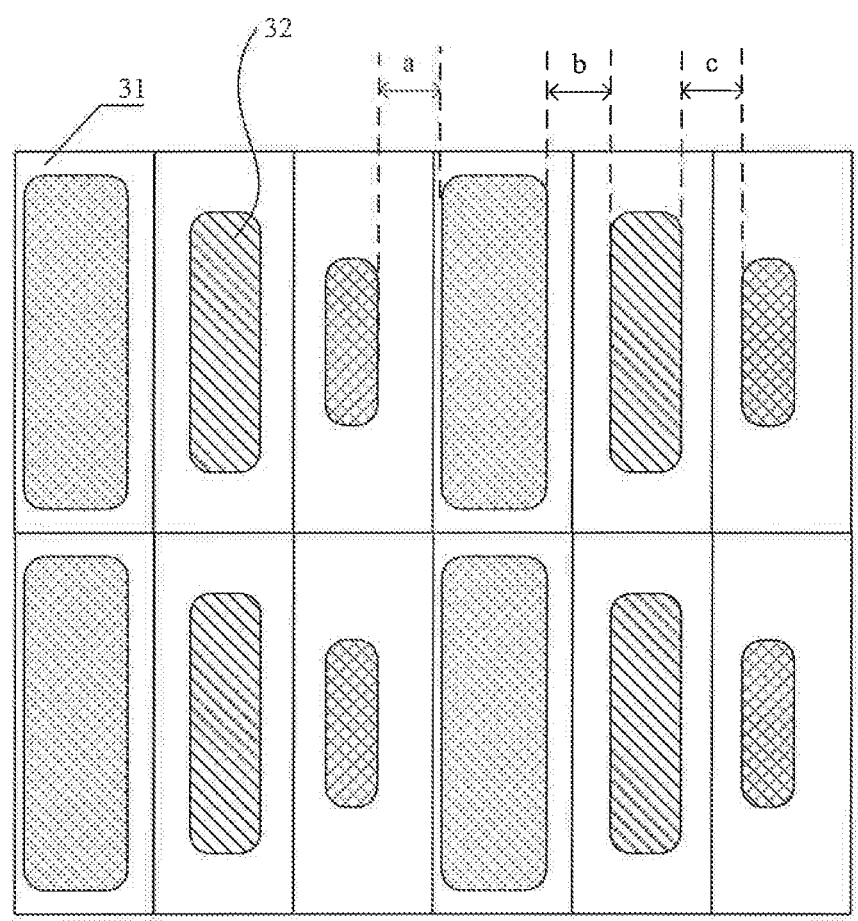
FIG. 3 shows a schematic diagram of another pixel defining layer according to the exemplary embodiment.
Figure 4:
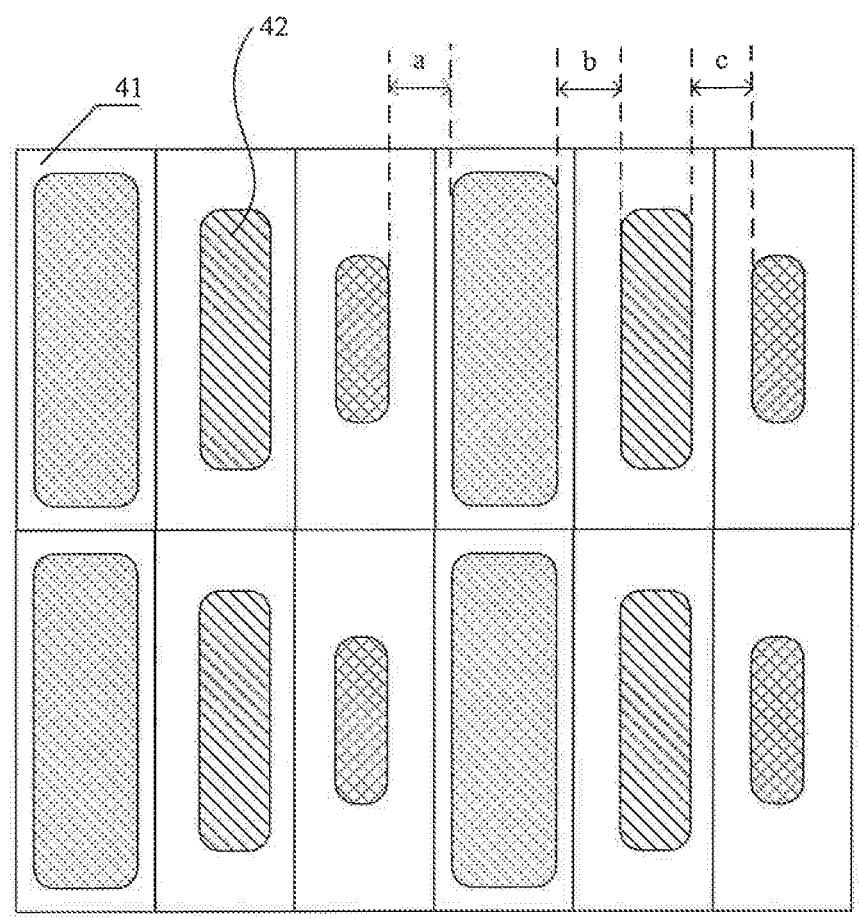
FIG. 4 shows a schematic diagram of yet another pixel defining layer according to the exemplary embodiment.

Based on the above-mentioned exemplary embodiment, FIGS. 3 and 4 show two schematic diagrams of the pixel defining layer according to other exemplary embodiments of the present disclosure respectively.

Compared with the structure shown in FIG. 1, the pixel defining layer shown in FIG. 3 includes the plurality of pixel defining patterns 31 distributed in a matrix, each pixel defining pattern 31 has one opening 32, the adjacent pixel defining patterns 31 in the same row have the openings 32 with different widths in the first direction, and the two adjacent openings 32 in the same row have equal minimum distance. The centers of the pixel defining patterns corresponding to at least two of one group of red, green and blue pixel units are inconsistent with the centers of the openings thereof.

Taking FIG. 3 as an example, the openings arranged in the first row define the blue, green and red pixel units successively, and then repetition is made, the center of the blue pixel unit is shifted leftwards relative to the center of the blue pixel defining pattern, the center of the green pixel unit is not shifted relative to the center of the green pixel defining patterns, and the center of the red pixel unit is shifted leftwards relative to the center of the red pixel defining pattern. In this way, the minimum distance a between the boundary of the red pixel unit and the boundary of the adjacent blue pixel unit is equal to the minimum distance b between the boundary of the blue pixel unit and the boundary of the adjacent green pixel unit, and also equal to the minimum distance c between the boundary of the green pixel unit and the boundary of the adjacent red pixel unit, i.e., a=b=c.

Compared with the structure shown in FIG. 1, the pixel defining layer shown in FIG. 4 includes the plurality of pixel defining patterns 41 distributed in a matrix, each pixel defining pattern 41 has one opening 42, the adjacent pixel defining patterns 41 in the same row have the openings 42 with different widths in the first direction, and the two adjacent openings 42 in the same row have equal minimum distance. The centers of the pixel defining patterns corresponding to at least two of one group of red, green and blue pixel units are inconsistent with the centers of the openings thereof.

Taking FIG. 4 as an example, the openings arranged in the first row define the blue, green and red pixel units successively, and then repetition is made, the center of the blue pixel unit is not shifted relative to the center of the blue pixel defining pattern, the center of the green pixel unit is shifted rightwards relative to the center of the green pixel defining patterns, and the center of the red pixel unit is not shifted relative to the center of the red pixel defining pattern. In this way, the minimum distance a between the boundary of the red pixel unit and the boundary of the adjacent blue pixel unit is equal to the minimum distance b between the boundary of the blue pixel unit and the boundary of the adjacent green pixel unit, and also equal to the minimum distance c between the boundary of the green pixel unit and the boundary of the adjacent red pixel unit, i.e., a=b=c.

The pixel defining layer shown in FIGS. 3 and 4 may also achieve the same technical effects as the pixel defining layer shown in FIG. 2, and is not repeated herein.

It should be noted that FIGS. 2-4 in the present disclosure show schematically the shift of the center of the pixel unit relative to the center of the pixel defining pattern, but the present disclosure is not limited thereto, and other shifts may occur, which may be adjusted and selected specifically according to design and manufacturing demands, as long as the two closest boundaries of the two adjacent openings in the same row (i.e., the two closest boundaries of the adjacent pixel units) have equal minimum distance.

The present exemplary embodiment further provides a pixel structure, including a pixel defining layer and a plurality of pixel units, wherein the pixel defining layer is configured for defining a plurality of pixel regions on the base substrate, and the plurality of pixel units correspond to the plurality of pixel regions respectively.

In the present exemplary embodiment, the pixel units may be located in the openings of the pixel defining layer, for example, the organic light-emitting material layer of the pixel unit may be formed in the corresponding opening by inkjet printing or the like after the pixel defining layer is formed.

For example, the pixel units may be located in the openings of the pixel defining layer, which does not mean that the organic light-emitting material layers of the pixel units are only located in the openings of the pixel defining layer. For example, the organic light-emitting material layers of the pixel units may be located in the openings and on the peripheries thereof. For example, an anode electrode of the pixel unit is exposed through the opening of the pixel defining pattern, the organic light-emitting material layer comes into contact with the anode electrode through the opening, and thus the pixel units form effective light-emitting regions at the openings of the pixel defining layer.

The pixel structure may achieve the same technical effects as the above-mentioned pixel defining layer, and is not repeated herein.

The present exemplary embodiment further provides a display panel, including a base substrate and a pixel structure formed thereon, wherein the pixel structure is the above-mentioned pixel structure.

The display panel may achieve the same technical effects as the above-mentioned pixel structure, and is not repeated herein.

Based on the foregoing descriptions, the present exemplary embodiment further provides a display device, including the above-mentioned display panel, and the display device may achieve the same technical effects as the above-mentioned display panel, and is not repeated herein.

It should be noted that the display device may be any product or component with a display function, such as a display panel, electronic paper, a mobile phone, a tablet computer, a television, a display, a notebook computer, a digital photo frame, a navigator, or the like.

The foregoing is merely exemplary embodiments of the invention, but is not used to limit the protection scope of the invention. The protection scope of the invention shall be defined by the attached claims.

What is claimed is:

1. A pixel defining layer, comprising:
   a plurality of pixel defining patterns arranged in a row direction and a column direction, each of the pixel defining patterns having an opening,
   wherein, in the row direction, the openings in at least two adjacent pixel defining patterns have different sizes, and adjacent openings of the pixel defining patterns in the same row have equal minimum distances in the row direction,
   wherein the plurality of pixel defining patterns comprise a first pixel defining pattern, a second pixel defining pattern and a third pixel defining pattern which have different sizes in the row direction, and centers of at least two of the first, second and third pixel defining patterns are not inconsistent with centers of the corresponding openings.

2. The pixel defining layer according to claim 1, wherein the pixel defining patterns are made of an insulating material.

3. The pixel defining layer according to claim 1, wherein the plurality of pixel defining patterns have profiles with identical shape and size.

4. The pixel defining layer according to claim 1, wherein the adjacent pixel defining patterns are in contact with each other.

5. The pixel defining layer according to claim 1, wherein the adjacent pixel defining patterns are formed integrally.

6. The pixel defining layer according to claim 1, wherein the adjacent openings arranged in a same row are configured for defining pixel units in different colors.

7. The pixel defining layer according to claim 6, wherein the openings arranged in a same column are configured for defining pixel units in a same color.

8. The pixel defining layer according to claim 1, wherein the pixel defining patterns comprises:
   a red pixel defining pattern having a first opening, for defining a red pixel unit;
   a green pixel defining pattern having a second opening, for defining a green pixel unit; and
   a blue pixel defining pattern having a third opening, for defining a blue pixel unit.

9. The pixel defining layer according to claim 8, wherein a width of the first opening is less than a width of the second opening, and the width of the second opening is less than a width of the third opening.

10. The pixel defining layer according to claim 1, wherein the adjacent openings of the pixel defining patterns arranged in a same column have equal minimum distances in the column direction.

11. A pixel structure, comprising:
    the pixel defining layer according to claim 1, for defining a plurality of pixel regions on a base substrate; and
    a plurality of pixel units provided in the plurality of pixel regions respectively.

12. The pixel structure according to claim 11, wherein the pixel units are located in the openings of the pixel defining layer.

13. A display panel, comprising:
    a base substrate; and
    a pixel structure formed on the base substrate, wherein the pixel structure is the pixel structure according to claim 11.

14. A display device, comprising the display panel according to claim 13.

* * * * *